United States Patent
Hammes et al.

(10) Patent No.: US 8,559,969 B2
(45) Date of Patent: Oct. 15, 2013

(54) METHOD AND SYSTEM FOR SHARING A CLOCK REFERENCE SIGNAL WITHIN AN INTEGRATED MOBILE DEVICE

(75) Inventors: Markus Hammes, Dinslaken (DE); Stefan van Waasen, Kolbermoor (DE)

(73) Assignee: Intel Mobile Communications GmbH, Neubiberg (DE)

( * ) Notice: Subject to any disclaimer, the term of this patent is extended or adjusted under 35 U.S.C. 154(b) by 744 days.

(21) Appl. No.: 12/210,763

(22) Filed: Sep. 15, 2008

(65) Prior Publication Data
US 2010/0069085 A1   Mar. 18, 2010

(51) Int. Cl.
*H04W 24/00* (2009.01)
*G01S 19/13* (2010.01)
*G01S 19/23* (2010.01)

(52) U.S. Cl.
USPC ............. 455/456.1; 342/357.51; 342/357.62

(58) Field of Classification Search
USPC ........ 455/556.1, 556.2, 557, 570, 114.2, 123, 455/125, 136, 137, 164.1, 164.2, 255–260, 455/265, 264; 342/457.51, 357.27, 357.57, 342/357.31, 357.68
See application file for complete search history.

(56) References Cited

U.S. PATENT DOCUMENTS

| 6,630,872 | B1 * | 10/2003 | Lanoue et al. ............... 331/176 |
| 6,741,842 | B2 * | 5/2004 | Goldberg et al. .......... 455/192.2 |
| 7,299,024 | B2 * | 11/2007 | Bloebaum et al. ............ 455/258 |
| 7,466,975 | B2 * | 12/2008 | Feher ........................ 455/404.2 |
| 7,917,155 | B2 * | 3/2011 | Karr et al. .................. 455/456.1 |
| 7,956,804 | B2 * | 6/2011 | Jin et al. ................... 342/357.68 |
| 2003/0214432 | A1 * | 11/2003 | Tawadrous et al. ........ 342/357.1 |
| 2004/0214538 | A1 * | 10/2004 | Ballantyne et al. .......... 455/141 |
| 2007/0183484 | A1 | 8/2007 | Brehler et al. |
| 2007/0205939 | A1 * | 9/2007 | Bae .......................... 342/357.02 |
| 2007/0241956 | A1 * | 10/2007 | Jin ............................ 342/357.1 |
| 2009/0109087 | A1 * | 4/2009 | Gronemeyer .............. 342/357.1 |
| 2009/0231188 | A1 * | 9/2009 | Yanni et al. ............. 342/357.06 |
| 2009/0278616 | A1 * | 11/2009 | Nicholls et al. ................ 331/44 |

FOREIGN PATENT DOCUMENTS

EP   1512985 A2   3/2005

* cited by examiner

*Primary Examiner* — Andrew Wendell
*Assistant Examiner* — Cindy Trandai
(74) *Attorney, Agent, or Firm* — Eschweiler & Associates, LLC

(57) ABSTRACT

A method and system of a GPS system controlling a voltage of an input signal to an oscillator, the oscillator producing a clock reference signal to the GPS system and a modem system, such that a frequency of the clock reference signal is altered to synchronize the modem system with a corresponding network while the GPS system remains in a locked state.

19 Claims, 4 Drawing Sheets

METHOD AND SYSTEM FOR SHARING A CLOCK REFERENCE SIGNAL WITHIN AN INTEGRATED MOBILE DEVICE

FIELD OF THE INVENTION

The field of the present disclosure relates to mobile wireless devices coupled with object location systems. Specifically, the present disclosure relates to sharing an oscillator between a global positioning system and a modem system in a mobile wireless device.

BACKGROUND

Mobile wireless devices, i.e. cellular telephones, personal digital assistants (PDA), etc., are constructed with an oscillator. More specifically, a mobile wireless device employing second-generation wireless telephone technology (2G) is constructed with a digital controlled crystal oscillator (DCXO) and a mobile wireless device employing third-generation wireless telephone technology (3G) is constructed with a temperature-compensated voltage controlled crystal oscillator (TCVCXO). The frequency of the oscillator (DCXO or TCVCXO) of the mobile wireless device is altered such that the mobile wireless device is synchronized with its corresponding network (i.e. 2G or 3G). The synchronization is achieved employing the time/frequency information from the corresponding network.

Mobile wireless devices can be used in conjunction with a global positioning device system (GPS) for communicating the location thereof, and thus, the mobile wireless device when incorporated into the mobile wireless device. The GPS system is constructed with a dedicated TCVCXO so that a reference clock signal thereto is uninfluenced by possible corrections of the oscillator frequency in the modem system of the mobile wireless device. The dedicated TCVCXO of the GPS system is employed to optimize parameters including time to first fix (TTFF), pseudo range, etc. The dedicated TCVCXO, by comparison with a crystal oscillator (XO), comprises a higher frequency accuracy in the case of possible temperature fluctuations (on account of the lower frequency dependence in the case of temperature fluctuations). The GPS system can also be constructed with a temperature-compensated crystal oscillator (TCXO).

The mobile wireless devices and GPS systems can be coupled together to reduce their combined cost and size by sharing the same housing and power supply, defining an integrated mobile device. To simplify the integrated mobile device and reduce manufacturing costs thereof, single components are employed to take the place of redundant components. One such redundant component is the oscillator that is located in both the GPS system and the mobile wireless device.

FIG. 1 shows a conventional integrated mobile device 100 comprising antenna 102, for transmitting a data signal to, and receiving a data signal from a mobile wireless device network; code division multiple access (CDMA) radio frequency (RF) processor 104; system TCVCXO 106 for generating and/or providing a reference frequency to various components in integrated mobile device 100; and automatic frequency control (AFC) signal 108 implemented with a frequency difference detector (not shown), a loop filter (not shown), and a digital-to-analog converter (not shown). Integrated mobile device 100 further comprises CDMA baseband processor 110 for processing a CDMA signal. CDMA baseband processor 110 includes digital-to-analog convertor (DAC) 112 and pulse density modulation (PDM) signal counter 114. A PDM signal generated from PDM signal generator 114 within CDMA baseband processor 110 is set to a predetermined bit output.

Integrated mobile device 100 further comprises GPS system 116 having GPS baseband processor 118 and GPS RF processor 120. GPS baseband processor 118 includes frequency compensation unit 122, carrier numerically controlled oscillator (NCO) 124, correlator 126, code generator 128, and code NCO 130. Carrier NCO 124 includes buffer registry (BR) 132, adder 134, and phase decoder (PD) 136. Buffer registry 132 can store a value to be added by adder 134 as a predetermined bit value. Correlator 126 outputs correlation data 138 to microcontroller unit 140.

A frequency of a CDMA signal input to integrated mobile device 100 is altered (e.g. due to motion of a user of integrated mobile device 100). A value of PDM signal counter 114 is then altered for synchronization acquisition according to the frequency change of the CDMA signal input, and thus, the output frequency of system TCVCXO 106 is altered/corrected to synchronize with the corresponding network. PDM signal counter 114 outputs the changed frequency value to frequency compensation unit 122. A value of buffer registry 132 is then altered based upon the changed frequency value via frequency compensation unit 122. This value is added to system TCVCXO 106 signal such that GPS system 116 is maintained in a locked state regardless of the automatic frequency control (AFC) operation of CDMA baseband processor 110.

It is desired to provide an improved system and method of employing a single oscillator for use by an integrated mobile device comprising both a modem system and a GPS system. The GPS system has compensation circuitry that allows the GPS system to continue to process signals when the oscillator is adjusted to maintain the mobile transmission frequency of the modem system.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

The present disclosure describes an integrated mobile device having a modem system and a GPS system. Many specific details are set forth in the following description and in FIGS. 1-4 to provide a thorough understanding of various implementations. One skilled in the art will understand, however, that the subject matter described herein may have additional implementations, or that the concepts set forth may be practiced without several of the details described in the following description.

The integrated mobile device of the present disclosure combines a modem system with a GPS system while employing a single oscillator for both, with the GPS system controlling an output signal of the oscillator. The GPS system has the higher requirement with regard to accuracy and stability of the reference clock, and as such, has control of the oscillator and an output signal of the oscillator.

Figure 1:
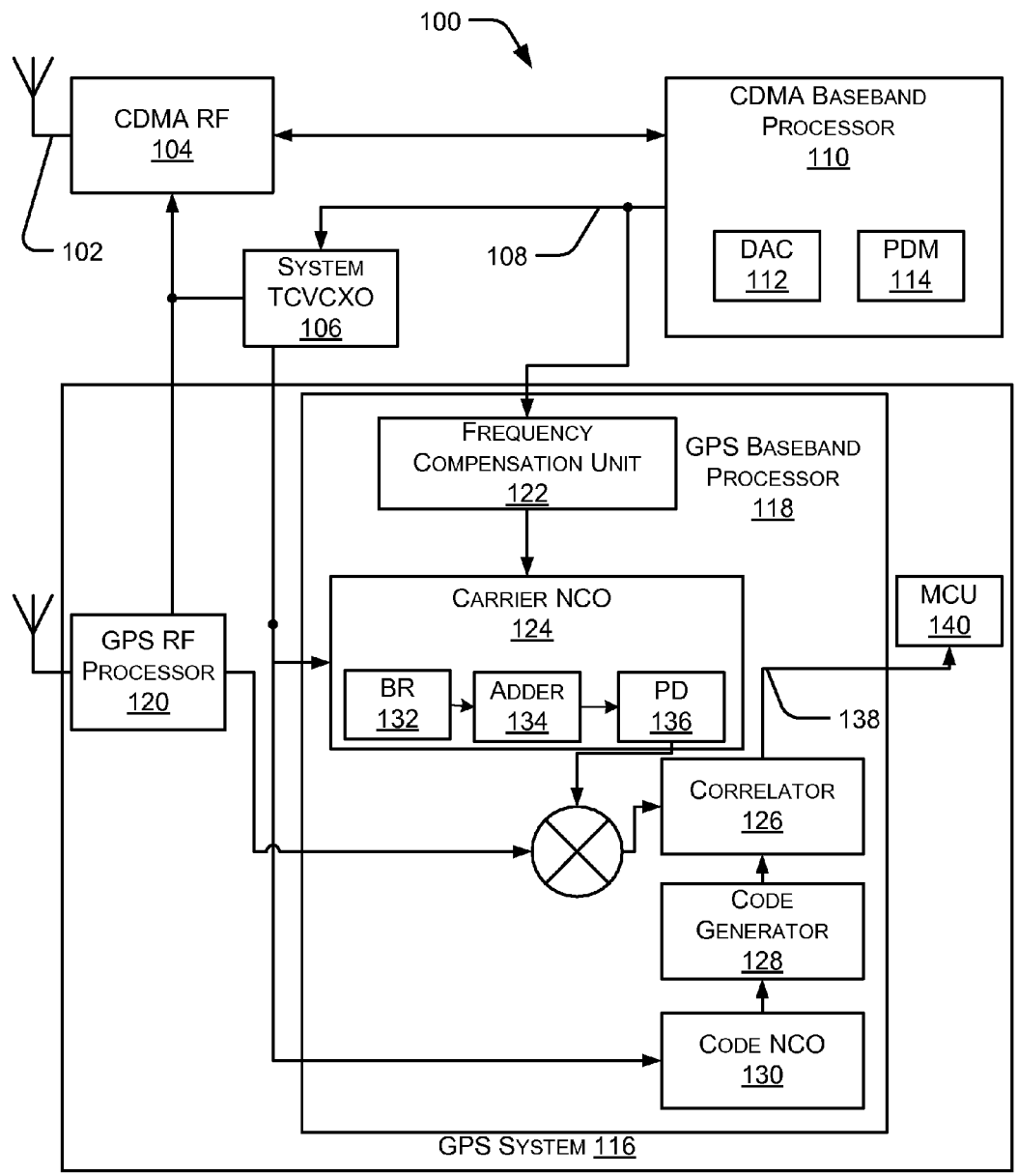
FIG. 1 is a block diagram of an integrated mobile device in accordance with the conventional art.
Figure 2:
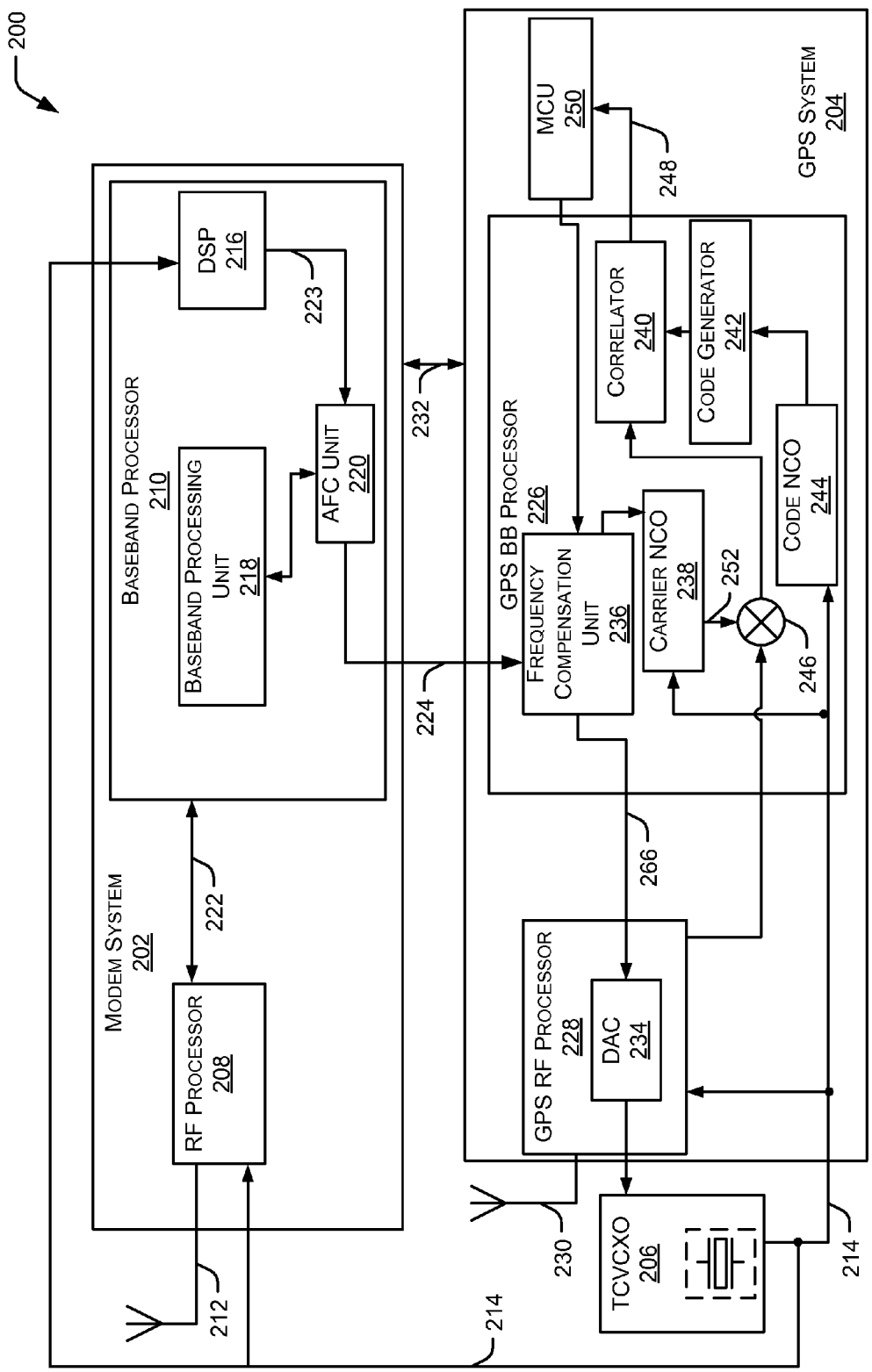
FIG. 2 is a block diagram of an integrated mobile device having a modem system and a GPS system and employing a single oscillator for both systems.

FIG. 2 shows integrated mobile device 200. Mobile device 200 comprises modem system 202, GPS system 204, and TCVCXO 206. TCVCXO 206 provides a reference clock signal that is input to modem system 202 and GPS system 204, described below. As compared with modem system 202, GPS system 204 has the higher requirement with respect to accuracy and stability of the clock reference signal. As such, TCVCXO 206 may be physically located at a thermally favorable position within integrated mobile device 200. The thermally favorable position may be a position where the influence of power dissipation of a power amplifier (not shown) of modem system 202 to TCVCXO 206 is minimized. In a further implementation, the thermally favorable position may be proximate to a camera module (not shown) of mobile device 200. GPS system 204 may be a general term and may mean any navigation/positioning device, including GPS, Galileo, Glonass, and any future navigation/positioning system.

Modem system 202 comprises RF processor 208, baseband processor 210, and antenna 212. Modem system 202 may be 2G or 3G, as described above in the Background section, and as a result, RF processor 208 and baseband processor 210 is 2G or 3G. However, in a further implementation, modem system 202 may employ any wireless telephone technology, i.e., fourth generation (4G), long term evolution (LTE), WiMax, or any future wireless telephone technology. RF processor 208 is coupled to output signal path 214 of TCVCXO 206. Baseband processor 210 comprises digital signal processor (DSP) 216, baseband processing unit 218, and automatic frequency control (AFC) unit 220. RF processor 208 is in communication with baseband processor 210 via communication path 222 to send/receive control signals and data therebetween.

Signals received by antenna 212 are coupled to RF processor 208. RF processor 208 provides amplification, filtering, and mixing operations to the signals received by antenna 212, which is well known in the art. RF processor 208 comprises components such as a phase-lock loop (not shown) to increase the frequency of the signal from TCVCXO 206 to a frequency that is useful for down conversion of the signal received by antenna 212. RF processor 208 shifts (down converts) the frequency spectrum to an intermediate frequency, and boosts the low-level signal received by antenna 212 to a level appropriate for processing by DSP 216.

DSP 216 comprises various circuits for extracting data and voice signals from the signal received by antenna 212, which is well known in the art. Further, DSP 216 compares the output signal of TCVCXO 206 on path 214 to the signal received by antenna 212 to produce a frequency error signal on path 223. The frequency error signal is processed by AFC 220 to produce a value (digital output) that represents the magnitude of the frequency error signal on path 224. The value of the frequency error signal is sent to GPS system 204 on path 224. In an example, the frequency error signal is the difference in hertz between the signal received by antenna 212 and the output signal of TCVCXO 206 on path 214. It is desired to have the output signal of TCVCXO 206 on path 214 and the signal received by antenna 212 to be substantially the same or within a desired tolerance, i.e., 0.1 ppm.

GPS system 204 comprises GPS baseband processor 226, GPS RF processor 228, and antenna 230. GPS system 204 is in communication with modem system 202 via communications path 232 to send/receive control signals and data therebetween. GPS RF processor 228 comprises digital-to-analog convertor (DAC) 234. GPS baseband processor 226 comprises frequency compensation unit 236, carrier NCO 238, correlator 240, code generator 242, code NCO 244, and mixer 246. Correlator 240 outputs correlation data 248 to microcontroller unit 250.

Frequency error signal on path 224 is coupled to the input of frequency compensation unit 236. Frequency compensation unit 236 is in communication with DAC 234 to produce an analog signal that is input to TCVCXO 206 for controlling the frequency of the output signal of TCVCXO 206 on path 214. As mentioned above, RF processor 208 employs the output signal along output signal path 214 from TCVCXO 206 such that modem system 202 is synchronized with its corresponding network. To that end, frequency compensation unit 236 alters the input voltage to TCVCXO 206 via DAC 234 such that the output signal of TCVCXO 206 on path 214 comprises a frequency to place modem system 202 in synchronization with the corresponding network. More specifically, frequency compensation unit 236 is coupled to DAC 234 via path 266 and produces a digital output thereon that corresponds to a voltage level that is input to TCVCXO 206. Frequency compensation unit 236 may communicate with DAC 234 by providing a value to DAC 234 via path 266 corresponding to a desired frequency of the output signal of TCVCXO 206 on path 214 or a delta value to DAC 234 via path 266 corresponding to a difference between the current frequency of the output signal of TCVCXO 206 on path 214 and the desired frequency of the output signal of TCVCXO 206 on path 214.

As a result of altering the frequency of the output signal of TCVCXO 206 on path 214, the clock reference signal input to GPS system 204 is altered, which leads to GPS system 204 not being in a phase lock, which is undesirable. More specifically, GPS system 204 is not able to demodulate navigation data/information received by antenna 230. It is desired to have the clock reference input signal to GPS system 204 uninfluenced by such possible corrections of the output signal of TCVCXO 206 on path 214 for modem system 202. Frequency compensation unit 236 compensates for such differences in the output signal of TCVCXO 206 on path 214 so that GPS system 204 remains functional, i.e., phase lock is maintained.

GPS RF processor 228 converts the received signal from antenna 230 into an intermediate frequency (IF) signal. GPS RF processor 228 converts the IF signal into a digital signal and then outputs the digital signal to mixer 246. Mixer 246 mixes a carrier frequency signal with the digital signal and then outputs a result of the mixing to correlator 240. Code NCO 244 generates a code frequency signal in which the phase has been corrected at a carrier frequency. Code generator 242 generates pseudo random noise (PRN) code of the signal received by antenna 230 in response to the code frequency signal. Correlator 240 correlates a signal output of mixer 246 with the PRN code to obtain a correlated sample, all of which is well known in the art.

Frequency error signal on path 224 is coupled to an input of frequency compensation unit 236. In an implementation, frequency error signal on path 224 may be coupled to frequency compensation unit 236 via standard interface or dedicated control lines. Frequency compensation unit 236 is in communication with carrier NCO 238. Carrier NCO 238 adds a value to the output signal of TCVCXO 206 on path 214 and outputs this signal on path 252 to mixer 246. As a result of compensating for output signal of TCVCXO 206 on path 214, GPS system 204 is maintained in a locked state regardless of altering the output signal of TCVCXO 206 on path 214.

Furthermore, TCVCXO 206 and the output signal along output signal path 214 is controlled by GPS system 204 by frequency compensation unit 236 and DAC 234 which provide the input voltage to TCVCXO 206.

Altering the input voltage to TCVCXO 206 may result in corresponding transients in the frequency change of the output signal of TCVCXO 206 on path 214. As such, these transients are counteracted by corresponding control for ideal compensation due to inverse compensating the expected frequency change. However, due to process tolerances, temperature changes, voltage changes, etc., such compensation is limited to a certain tolerance, i.e., approximately 10 ppb to 100 ppb.

Further, alterations to the input voltage to TCVCXO 206 are within a range of 1 µV. As a result, any noise on the input voltage to TCVCXO 206 is tolerated to a certain limit as a result of the frequency correction to modem system 202 being a closed control loop. To that end, to discern the accuracy of DAC 234, non-idealities of DAC 234, such as integral non-linearity (INL), differential nonlinearity (DNL), etc., are determined by means of a learning algorithm, under certain circumstances, and corrected after a learning phase. The learning algorithm can extract existing non-idealities out of the GPS correlation procedure and feed it into the correction procedure.

Figure 3:
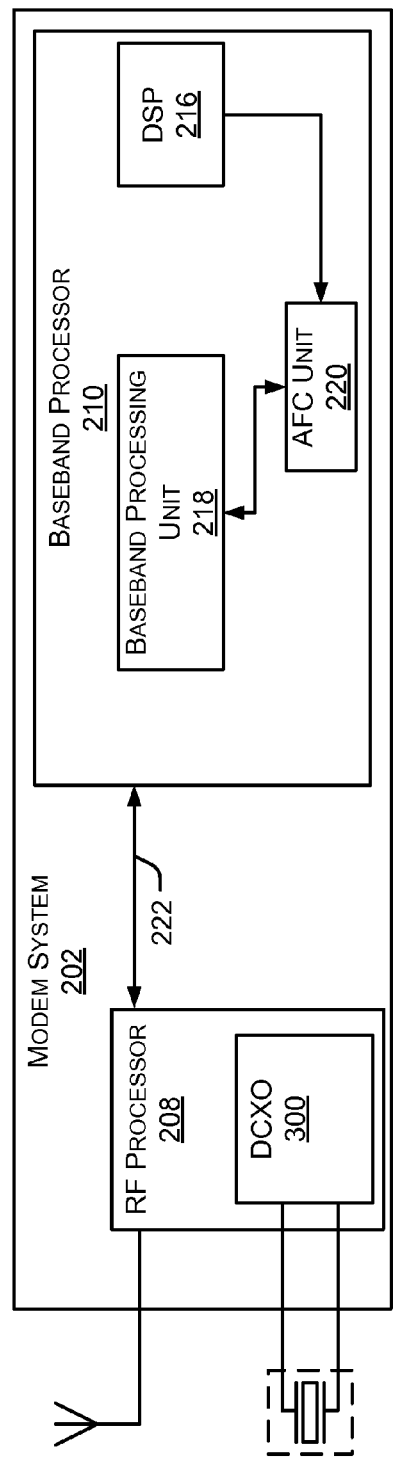
FIG. 3 is a block diagram of a modem system of the integrated mobile device, shown in FIG. 2, having a DCXO.

FIG. 3 shows modem system 202 of integrated mobile device 200 comprising DCXO 300, in a further implementation. DCXO 300 is removed from modem system 202 and TCVCXO 206 is employed as the reference clock input signal, as described above.

In a further implementation, GPS system 204 may comprise an analog-to-digital converter (ADC) (not shown) coupled to an input of frequency compensation unit 236 and coupled to RF processor 208 such that modem system 202 controls the output signal of TCVCXO 206 on path 214 while GPS system 204 monitors the output signal of TCVCXO 206 on path 214.

In a further implementation, GPS system 204 anticipates the change in frequency of the output signal of TCVCXO 206 on path 214 and therefore compensates for such a change in a more efficient manner. More specifically, as mentioned above, GPS system 204 alters the input voltage to TCVCXO 206 via DAC 234 such that the output signal of TCVCXO 206 on path 214 comprises a frequency to place modem system 202 in synchronization with its corresponding network. As a result, the clock reference signal input to GPS system 204 is altered. GPS system 204 measures the frequency of the output signal of TCVCXO 206 on path 214, for a given digital value on path 266, given at times t1 and t2 to determine a difference in the frequency of the output signal of TCVCXO 206 on path 214, with time t1 occurring prior to altering the frequency of the output signal of TCVCXO 206 on path 214 and time t2 occurring subsequent to altering the frequency of the output signal of TCVCXO 206 on path 214. In a further implementation, AFC unit 220 measures the frequency of the output signal of TCVCXO 206 on path 214.

After finding the difference in frequency of the output signal of TCVCXO 206 on path 214, GPS system 204 correlates the digital value on path 266 to the difference in the frequency of the output signal of TCVCXO 206 on path 214. As a result, after receiving the frequency error signal on path 224 from AFC unit 220, frequency compensation unit 236 determines the digital value to provide to DAC 234 via path 266 in a more precise manner such that the frequency change in the output signal along output signal path 214 of TCVCXO 206 is closer to the desired change in frequency. This is done so the output signal of TCVCXO 206 on path 214 comprises a frequency to place modem system 202 in synchronization with the corresponding network. The above-mentioned process may iterate such that the digital value provided to DAC 234 via path 266 by frequency compensation unit 236 is closer to a desired value to obtain the frequency in the output signal of TCVCXO 206 on path 214 that is within a desired range.

Figure 4:
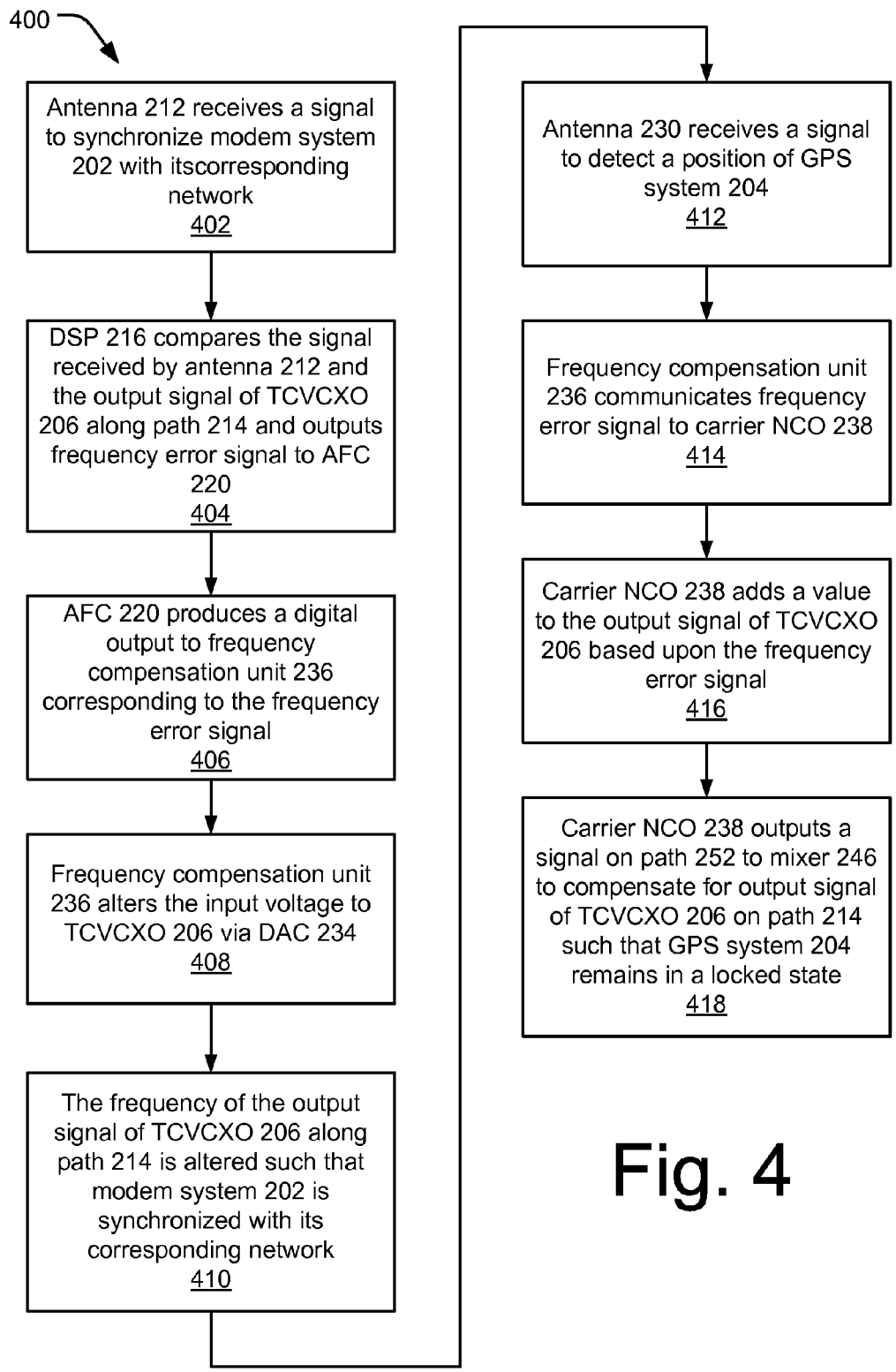
FIG. 4 is a process flow chart employing the integrated mobile device of FIG. 2.

FIG. 4 shows a process 400 of controlling TCVCXO 206 by GPS system 204 such that modem system 202 is in synchronization with its corresponding network while maintaining GPS system 204 in a locked loop. The process 400 is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in other orders and/or in parallel to implement the process.

At 402, antenna 212 receives a signal to synchronize modem system 202 with its corresponding network. At 404, DSP 216 compares the signal received by antenna 212 and the output signal of TCVCXO 206 on path 214 and outputs a frequency error signal to AFC 220 corresponding to the differenced in hertz therebetween. At 406, AFC 220 produces a digital output to frequency compensation unit 236 corresponding to the frequency error signal. At 408, frequency compensation unit 236 alters the input voltage to TCVCXO 206 via DAC 234. At 410, the frequency of the output signal of TCVCXO 206 on path 214 is altered such that modem system 202 is synchronized with its corresponding network. At 412, antenna 230 receives a signal to detect a position of GPS system 204. At 414, frequency compensation unit 236 communicates frequency error signal to carrier NCO 238. At 416, carrier NCO 238 adds a value to the output signal of TCVCXO 206 based upon the frequency error signal. At 418, carrier NCO 238 outputs a signal on path 252 to mixer 246 to compensate for output signal of TCVCXO 206 on path 214 such that GPS system 204 remains in a lock state.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method of sharing a clock reference signal of an oscillator that is input to a global positioning system (GPS) and a modem system within an integrated mobile device, the method comprising:
receiving an input signal at the modem system;
comparing the input signal with the clock reference signal at the modem system to define a frequency error signal;
altering a signal input at the oscillator by the GPS based upon the frequency error signal from the modem system to alter a frequency of the clock reference signal to synchronize the modem system with a corresponding network; and
altering a value to be added to the altered frequency clock reference signal that is employed by the GPS, wherein the value is based on the frequency error signal.

2. A method as recited in claim 1, further comprising communicating the frequency error signal to the GPS from the modem system.

3. A method as recited in claim 1, wherein the corresponding network is selected from a group of networks comprising 2G, 3G, 4G, WiMax, or long term evolution (LTE).

4. A method as recited in claim 1, further comprising measuring the frequency of the clock reference signal prior to and subsequent to altering the voltage of the signal input at the oscillator to define a difference and correlating a value of the frequency error signal to the difference.

5. A method as recited in claim 1, wherein the locked state of the GPS has a tolerance in a range of 10 ppb to 100 ppb.

6. A system comprising:
an oscillator to generate a clock reference signal;
a modem system comprising:
 a radio frequency (RF) processor to receive the clock reference signal;
 an antenna to receive an input signal; and
 a digital signal processor (DSP) configured to compare the input signal received by the antenna with the clock reference signal to define a frequency error signal; and
a global positioning system (GPS) comprising:
 a GPS radio frequency (RF) processor to receive the clock reference signal;
 a frequency compensation unit to receive the frequency error signal and alter a signal input to the oscillator based upon the frequency error signal from the modem system to alter a frequency of the clock reference signal to synchronize the modem system with a corresponding network; and
 a carrier numerically controlled oscillator in communication with the frequency compensation unit to add a value to the altered frequency clock reference signal that is employed by the GPS, wherein the value is based on the frequency error signal.

7. A system as recited in claim 6, wherein the oscillator is a temperature-compensated voltage controlled crystal oscillator.

8. A system as recited in claim 6, wherein the oscillator is a digital controlled crystal oscillator.

9. A system as recited in claim 6, wherein the modem system further comprises an automatic frequency control (AFC) unit to produce a digital value that represent a magnitude of the frequency error signal.

10. A system as recited in claim 6, wherein the GPS further comprises a digital to analog converter (DAC) to convert a digital output of the frequency compensation unit to an analog signal to input to the oscillator.

11. A system as recited in claim 10, wherein the GPS RF processor comprises the DAC.

12. A system as recited in claim 6, wherein the GPS further comprises an antenna to receive an additional input signal.

13. A method of sharing a clock reference signal of an oscillator that is input to a global positioning system (GPS) and a modem system, both within an integrated mobile device, the method comprising:

receiving an input signal by the modem system;
comparing the input signal with the clock reference signal by the modem system, defining a frequency error signal;
converting the frequency error signal to a digital value;
communicating the frequency error signal to the GPS;
altering a signal input to the oscillator by the GPS via a digital to analog convertor (DAC) based upon the frequency error signal from the modem system to alter a frequency of the clock reference signal to synchronize the modem system with a corresponding network;
converting the clock reference signal to a digital value; and
adding a value to the altered frequency clock reference signal that is employed by the GPS, wherein the value is based on the frequency error signal.

14. A method as recited in claim 13, wherein synchronizing the modem system further comprises the corresponding network being selected from a group of networks comprising 2G, 3G, 4G, WiMax, or long term evolution (LTE).

15. A method as recited in claim 13, further comprising measuring the frequency of the clock reference signal prior to and subsequent to altering the voltage of the signal input to the oscillator to define a difference and correlating a value of the frequency error signal to the difference.

16. A mobile device comprising:
a modem system comprising a digital signal processor (DSP) configured to compare an input signal received by the modem system with a clock reference signal generated by a single oscillator to define a frequency error signal; and
a global positioning system (GPS) comprising a frequency compensation unit to receive the frequency error signal and alter a signal input to the single oscillator based upon the frequency error signal from the modem system to alter a frequency of the clock reference signal to synchronize the modem system with a corresponding network, the single oscillator being shared between the modem system and the GPS and being controlled by the GPS, and wherein the GPS is configured to alter a value to be added to the altered frequency clock reference signal that is employed by the GPS, wherein the value is based on the frequency error signal.

17. A system as recited in claim 16, wherein the GPS comprises a carrier numerically controlled oscillator in communication with the frequency compensation unit to add a value stored therein with the clock reference signal such that the GPS remains in a locked state.

18. A system as recited in claim 16, wherein the modem system further comprises an automatic frequency control (AFC) unit to produce a digital value that represents a magnitude of the frequency error signal.

19. A system as recited in claim 16, wherein the GPS further comprises a digital to analog converter (DAC) to convert a digital output of the frequency compensation unit to an analog signal to input to the single oscillator.

* * * * *